(12) United States Patent
Umazaki

(10) Patent No.: US 6,548,815 B1
(45) Date of Patent: Apr. 15, 2003

(54) PLANAR TYPE RADIATION DETECTOR

(75) Inventor: Hiroko Umazaki, Otawara (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/542,909

(22) Filed: Apr. 4, 2000

(30) Foreign Application Priority Data

Apr. 5, 1999 (JP) .......................................... 11-097581

(51) Int. Cl.$^7$ ................................................. G01T 1/24
(52) U.S. Cl. ............................................... 250/370.09
(58) Field of Search ....................... 250/370.09, 370.08

(56) References Cited

U.S. PATENT DOCUMENTS

| | | | | | |
|---|---|---|---|---|---|
| 4,261,794 A | * | 4/1981 | Yue | ............................. | 376/287 |
| 5,239,568 A | * | 8/1993 | Grenier | ....................... | 378/147 |
| 5,753,921 A | | 5/1998 | Trauernicht et al. | ... | 250/370.09 |
| 5,777,335 A | | 7/1998 | Mochizuki et al. | .... | 250/370.09 |

FOREIGN PATENT DOCUMENTS

JP          7-246199          9/1995

* cited by examiner

Primary Examiner—Constantine Hannaher
Assistant Examiner—Shun Lee
(74) Attorney, Agent, or Firm—Oblon, Spivak, McClelland, Maier & Neustadt, P.C.

(57) ABSTRACT

A radiation detector has conversion elements for converting radiation incident from the front side into charges, an electric charge read out elements arranged on the rear side of the conversion elements, the supporting plate of the electric charge read out elements, and a first plate as a main shielding plate arranged on the rear side of the supporting plate. The first plate effectively prevents the leakage radiation or reduces the leakage radiation to the standard value. The first plate, however, generates a large amount of backscattering ray. When the backscattering ray reaches the conversion elements, noise charges are generated to degrade the image quality. A second plate is characteristically inserted between the first plate and the supporting plate. The second plate is designed to have a radiation absorbed dose that is not zero but much littler than that of the first plate. The second plate can sufficiently shield the relatively weak backscattering ray generated by the first plate from the conversion elements. Since the second plate has a small radiation absorbed dose, the second plate itself rarely generates the backscattering ray. The backscattering ray generated by the second plate, therefore, does not reach the conversion elements to generate noise charges and degrade the image quality.

20 Claims, 4 Drawing Sheets

PLANAR TYPE RADIATION DETECTOR

CROSS-REFERENCE TO RELATED APPLICATIONS

This application is based upon and claims the benefit of priority from the prior Japanese Patent Application No. 11-097851, filed Apr. 5, 1999, the entire contents of which are incorporated herein by reference.

BACKGROUND OF THE INVENTION

1. Field of the Invention

The present invention relates to a planar type radiation detector installed in an image generation apparatus such as an X-ray diagnosis apparatus using radiation.

2. Discussion of Background

The past mainstream was X-ray inspection using a film. However, the recent remarkable improvement in space and energy resolution associated with a planar type radiation detector allows rapid shift from X-ray inspection using only a film to digital X-ray inspection. In the field of digital X-ray inspection as well, a conventional scheme of combining a bulky image intensifier and a TV camera is being replaced with a scheme using a planar type radiation detector that is a lightweight and compact low-profile device excellent in spatial and energy resolution.

FIG. 1 shows a typical example of a film cassette 100 setting an X-ray film 101 and an intensifying screen 104 between sponges 102.

Most components of an incident X-ray energy are absorbed by the film and the screen. However, the remaining energy components pass through the film, and the screen. A lead plate 103 is bonded to the rear plane of the sponge 102 to prevent the transmission X-ray (to be referred to as a first transmission X-ray hereinafter) from externally leaking or attenuate the transmission X-ray to a safety standard value.

However, this lead plate 103 poses the following problem. The lead plate 103 is designed primarily aiming at prevention or reduction of the leakage X-ray. On the other hand, an X-ray transmitting the film 101, the screen 104, and sponges 102 can reflect from the lead plate 103. In short, a backscattering ray is generated from the lead plate 103. This backscattering ray may generate charges in the conversion elements. The charges generated by the backscattering ray become noise that deteriorates the image quality.

More specifically, when the material, thickness and/or shape of the shielding plate are so designed as to increase the radiation absorbed dose, the scattered radiation dose also becomes large accordingly. Hence, the larger the radiation absorbed dose is set to reduce the leakage X-ray, the larger the scattered radiation dose becomes to result in an increase in noise.

The purpose of suppressing leakage X-ray has priority over the purpose of reducing noise. Hence, the purpose of reducing noise is sacrificed.

An X-ray detector disclosed in U.S. Pat. No. 5,777,335 suffers a similar problem.

The X-ray detector disclosed in U.S. Pat. No. 5,777,335 has a phosphor 4 for converting an X-ray into light, a conversion element 1 for converting light into charges, and a supporting plate 2 of the conversion element 1. A supporting plate 3 or lead plate 5 for absorbing and shielding an X-ray is provided behind the supporting plate 2. This X-ray detector disclosed in U.S. Pat. No. 5,777,335 also suffers a problem that the backscattering ray generated by the supporting plate 3 or lead plate 5 generates noise charges in the conversion element 1.

An X-ray detector disclosed in U.S. Pat. No. 5,753,921 employs a scheme of converting an X-ray into light by a converter 12 and then converting the light into charges by a detection array 14, as shown in FIG. 1 of this prior art. Together with a backing 24, a supporting plate 22 of the detection array 14 constructs a support unit 20 for physically supporting the converter 12 and detection array 14. As a characteristic feature of this prior-art invention, an element with an atomic number of 22 or more is contained in a supporting plate 22 of the detection array 14, thereby imparting the absorbing and shielding function to the supporting plate 22.

BRIEF SUMMARY OF THE INVENTION

It is an object of the present invention to suppress a backscattering ray generated by a shielding plate from reaching a charge conversion element in a planar type radiation detector having the shielding plate designed to prevent leakage of radiation or attenuate the leakage radiation more than a standard value.

A radiation detector has conversion elements for converting radiation incident from the front side into charges, an electric charge read out elements arranged on the rear side of the conversion elements, the supporting plate of the electric charge read out elements, and a first plate as a main shielding plate arranged on the rear side of the supporting plate. The first plate effectively prevents the leakage radiation or reduces the leakage radiation to the standard value. The first plate, however, generates a large amount of backscattering ray. When the backscattering ray reaches the conversion elements, noise charges are generated to degrade the image quality. A second plate is characteristically inserted between the first plate and the supporting plate. The second plate is designed to have a radiation absorbed dose that is not zero but much littler than that of the first plate. The second plate can sufficiently shield the relatively weak backscattering ray generated by the first plate from the conversion elements. Since the second plate has a small radiation absorbed dose, the second plate itself rarely generates the backscattering ray. The backscattering ray generated by the second plate, therefore, does not reach the conversion elements to generate noise charges and degrade the image quality.

Additional objects and advantages of the present invention will be set forth in the description which follows, and in part will be obvious from the description, or may be learned by practice of the present invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrated presently preferred embodiments of the present invention and, together with the general description given above and the detailed description of the preferred embodiments given below, serve to explain the principles of the present invention.

DETAILED DESCRIPTION OF THE INVENTION

Planar type radiation detectors according to preferred embodiments of the present invention will be described below in detail. As a radiation detector, an X-ray detector will be exemplified below. However, the present invention can also be applied to a detector for any other radiation such as a gamma ray.

First Embodiment

Figure 1:
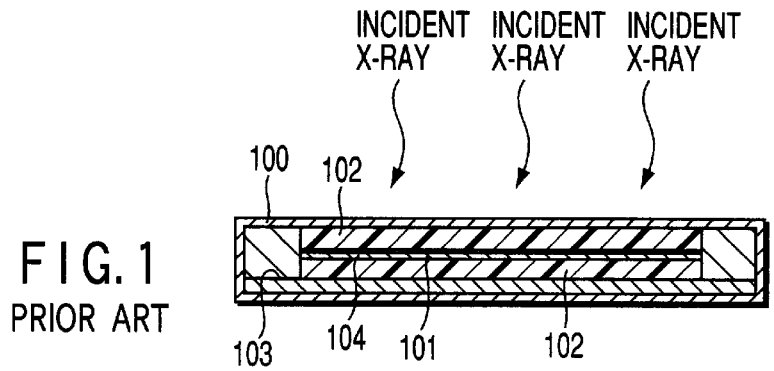
FIG. 1 is a sectional view of a conventional cassette.
Figure 2:
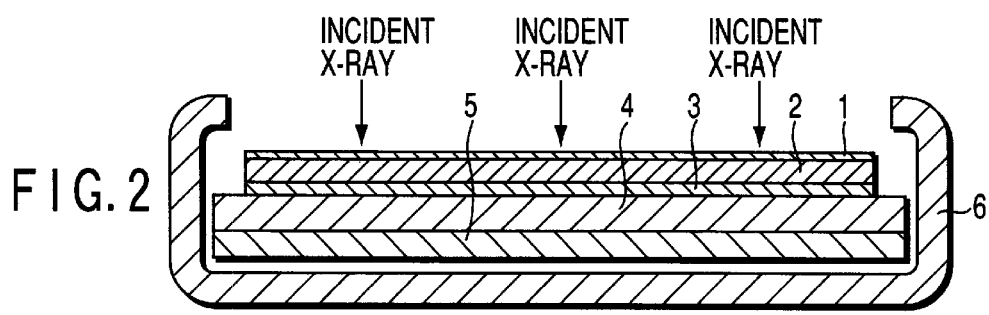
FIG. 2 is a sectional view showing the main part of a planar type radiation detector according to the first embodiment of the present invention.

FIG. 2 shows a section of a planar type radiation detector according to the first embodiment. Conversion elements 1 have a plurality of conversion elements for converting an X-ray incident from the front side into charges. As a conversion scheme, an indirect conversion scheme of converting an X-ray into light by a scintillator element and then converting the light into charges by a photoelectric conversion element represented by a photodiode, or a direct conversion scheme represented by amorphous selenium using a phenomenon that electron-hole pairs generated in a semiconductor by X-ray irradiation move to electrodes can be used.

An electric charge read out elements 2 is attached on a rear plane of the conversion elements 1. The electric charge read out elements 2 has a plurality of switching elements to individually read out charges stored in the conversion elements 1. The electric charge read out elements 2 is formed on a supporting plate 3. Typically, each switching element is formed from a thin-film transistor, and the supporting plate 3 is a glass plate.

The supporting plate 3 has, on its rear plane, a general shielding plate (to be referred to as a first plate hereinafter) 5 for preventing leakage of an X-ray or reducing the leakage X-ray more than a standard value.

A second plate 4 is characteristically inserted between the first plate 5 and the supporting plate 3 of the electric charge read out elements 2. More specifically, the second plate 4 is attached on a rear plane of the supporting plate 3 to physically support the supporting plate 3. The relatively soft first plate 5 is attached on the rear plane of the second plate 4 and physically supported by the relatively rigid second plate 4.

The conversion elements 1, the read out elements 2, the supporting plate 3, the second plate 4 and the first plate 5 are accommodated in a casing 6. The conversion elements 1 are placed inside an incident window of the casing 6. Areas of plate 4, 5 are larger than an array area of the conversion elements 1. The plates 4, 5 overhang from edges of elements 1, elements 2 and the plate 3. The overhang portions can shield back scattering rays from side walls of the casing 6.

Figure 3:
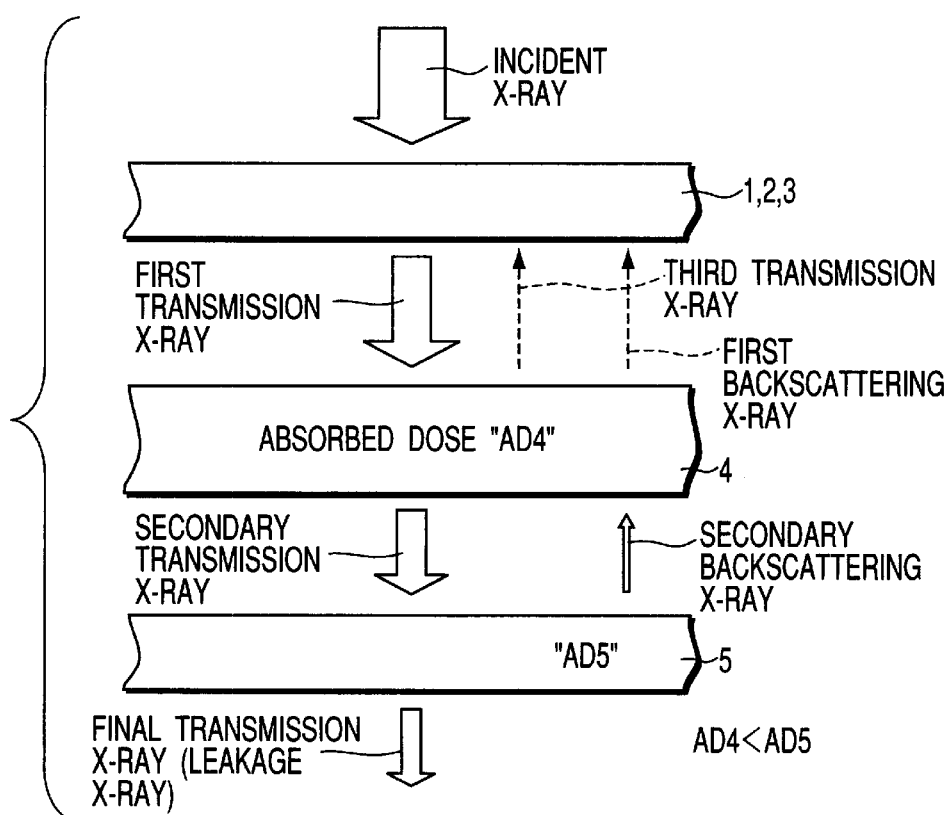
FIG. 3 is a view showing attenuation, absorption, and backscattering of an X-ray in charge read out elements (TFTS), iron plate, and lead plate shown in FIG. 2.

Since the second plate 4 is inserted between the first plate 5 and the supporting plate 3, the problem that the backscattering ray generated by the first plate 5 reaches the conversion elements 1 to generate noise charges can be solved. Details will be described below with reference to FIG. 3.

The material, thickness and/or shape of the second plate 4 are designed such that the radiation absorbed dose becomes much littler than that of the first plate 5 but not zero. Let AD4 be the radiation absorbed dose of the second plate 4, and AD5 be the radiation absorbed dose of the first plate 5. The second and first plates 4 and 5 are designed such that the relation AD4<AD5 holds. In other words, the material, thickness and/or shape of the second plate are designed to generate a scattering ray in a littler amount than that of the first plate 5.

With this characteristic feature, most components of the X-ray (first transmission X-ray) transmitted through the conversion elements 1, electric charge read out elements 2, and supporting plate 3 are transmitted through the second plate 4. In addition, the backscattering ray (first backscattering ray) generated by the second plate 4 has a very small amount. Hence, the generation amount of noise charges due to the backscattering ray generated by the second plate 4 is suppressed to a small amount.

Materials will be described. The material of the second plate 4 has a radiation absorption coefficient littler than that of the first plate 5. The first plate 5 is typically formed from lead. The thickness of the first plate 5 made of lead is typically 1 mm or more. As the material of the second plate 4, an element with an atomic number of 22 or more is preferably used. Typically, iron is used. The thickness of the second plate 4 made of iron is typically 0.01 to 10 mm. The first plate 5 and second plate 4 need not be formed from a single material. The first plate 5 may contain lead as the main component, and the second plate 4 may contain iron as the main component. The second plate 4 may contain at least one of Cu and Pb as the main component.

The second plate 4 is formed from a material more rigid than that of the first plate 5. Alternatively, the thickness and/or shape of the second plate 4 are designed such that the rigidity of the second plate 4 becomes higher than that of the first plate 5. With this structure, the second plate 4 can protect the supporting plate 3 and first plate 5 from deformation and crack.

The X-ray (secondary transmission X-ray) transmitted through the second plate 4 reaches the first plate 5 having a large radiation absorbed dose. The X-ray (final transmission X-ray (leakage X-ray)) transmitted through the first plate 5 is attenuated to zero or an amount that satisfies the safety standard value. That is, the material, thickness and/or shape of the first plate 5 are designed such that the leakage X-ray is reduced to at least the safety standard value or less.

The first plate 5 having a large radiation absorbed dose generates a relatively large amount of backscattering ray (secondary backscattering ray).

The second plate 4 is irradiated with this secondary backscattering ray from the rear side. The secondary backscattering ray is inevitably much weaker than the first transmission X-ray.

The radiation absorbed dose of the second plate 4 is not zero although it is littler than that of the first plate 5. Hence, the second plate 4 rarely passes the very weak secondary backscattering ray, or the amount of the transmission X-ray (third transmission X-ray) is very small so that the image quality is rarely affected. That is, the material, thickness and/or shape of the second plate 4 are designed such that the backscattering ray generated by the first plate 5 is not substantially transmitted to the conversion elements 1.

As for noise reduction, to minimize the backscattering, the minimum thickness of the first plate 5 is most preferably determined within a range for satisfying a condition that the leakage X-ray exhibits at least the safety standard value or less. In addition, the minimum thickness of the second plate 4 is determined within a range for satisfying a condition that the backscattering ray generated by the first plate 5 is not substantially transmitted to the conversion elements 1. The maximum thickness of the second plate 4 is determined within a range for satisfying a condition that noise due to the first backscattering ray generated by the second plate 4 itself is substantially reduced to zero or a negligible level.

As described above, according to the first embodiment, the leakage radiation can be prevented or reduced to the standard value. In addition, the amount of the backscattering ray generated by the first plate 5 is so small that the second plate 4 can substantially shield the backscattering ray. For this reason, the backscattering ray generated by the first plate 5 does not reach the charge conversion element to generate noise charges and deteriorate the image quality, unlike the prior art. Furthermore, since the radiation absorbed dose of the second plate 4 is suppressed to the minimum, the backscattering ray generated by the second plate 4 has a very small amount and does not generate charges or deteriorate the image quality. Since the second plate 4 has a high rigidity, it can protect the supporting plate 3 such as a glass supporting plate that easily cracks or the soft first plate 5 formed from lead from physical damage.

Since the second plate 4 has properties representing that the heat transfer coefficient is larger than that of the first plate 5, the cooling effect for the electric charge read out elements 2 can be improved as compared to the conventional case wherein the first plate 5 is directly attached to the supporting plate 3.

Second Embodiment

Figure 4:
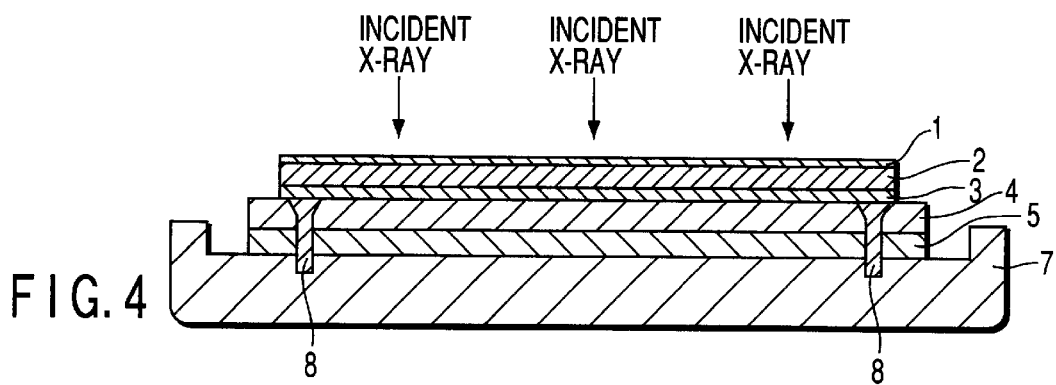
FIG. 4 is a sectional view showing the main part of a planar type radiation detector according to the second embodiment of the present invention.

As described above, a second plate 4 is formed from iron and has a high rigidity. For this reason, as shown in FIG. 4, the second plate 4 may be fixed to a base 7 via a first plate 5 using a firm fixing means such as screws 8.

The second plate 4 has a high rigidity, it can protect the supporting plate 3 such as a glass supporting plate that easily cracks or the soft first plate 5 formed from lead from physical damage.

Third Embodiment

Figure 5:
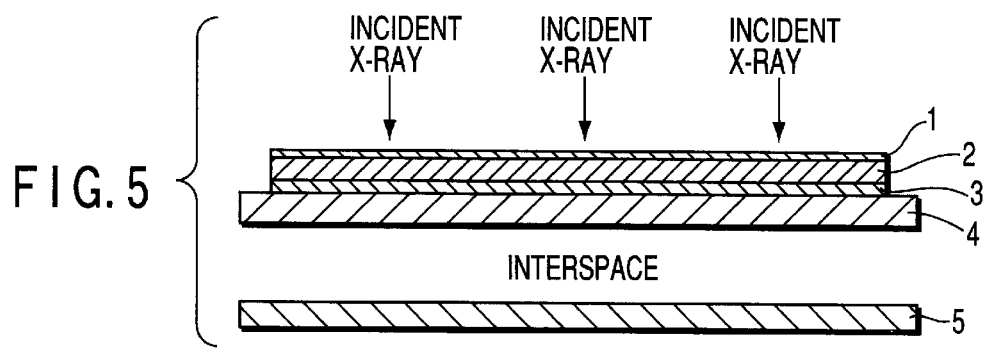
FIG. 5 is a sectional view showing the main part of a planar type radiation detector according to the third embodiment of the present invention.

In the first embodiment, the first plate 5 is attached on the rear plane of the second plate 4. However, a first plate 5 may be spaced apart from a second plate 4, as shown in FIG. 5.

Fourth Embodiment

Figure 6:
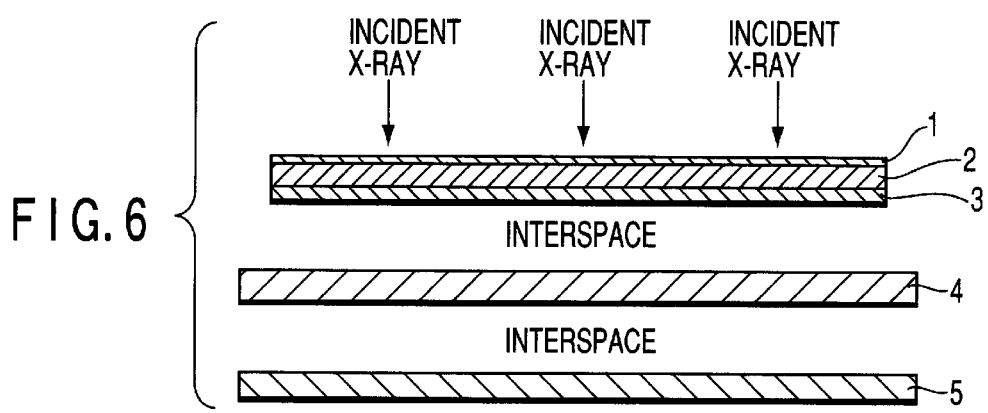
FIG. 6 is a sectional view showing the main part of a planar type radiation detector according to the fourth embodiment of the present invention.

As shown in FIG. 6, a first plate 5 may be spaced apart from a second plate 4, and the second plate 4 may also be spaced apart from a supporting plate 3.

Fifth Embodiment

Figure 7:
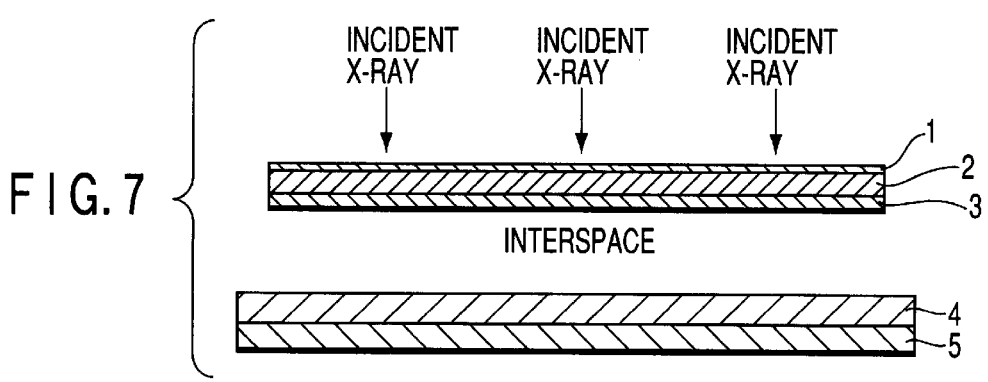
FIG. 7 is a sectional view showing the main part of a planar type radiation detector according to the fifth embodiment of the present invention.

As shown in FIG. 7, although a second plate 4 is spaced apart from a supporting plate 3, a first plate 5 may be attached to a rear plane of the second plate 4.

Sixth Embodiment

Figure 8:
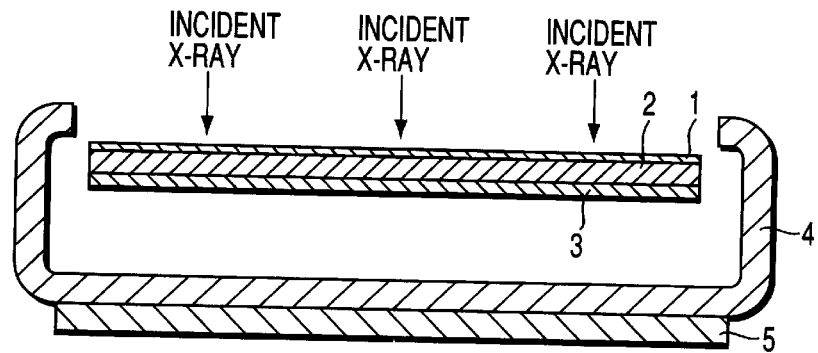
FIG. 8 is a sectional view showing the main part of a planar type radiation detector according to the sixth embodiment of the present invention.

As shown in FIG. 8, a second plate 4 may also serve as the casing of the detector, and a first plate 5 may be attached to a rear plane of the casing.

The lightweight, smaller and thin detector is realized.

Seventh Embodiment

Figure 9:
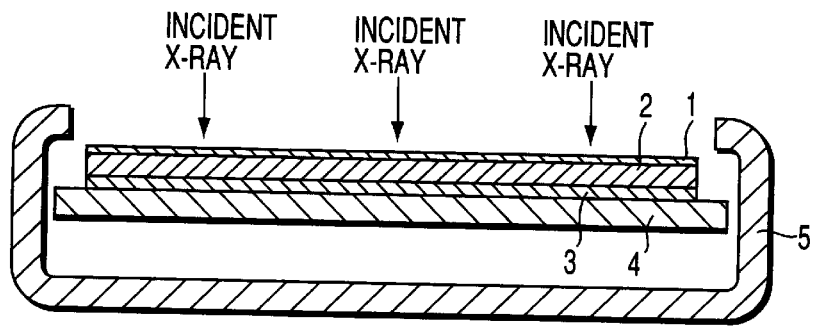
FIG. 9 is a sectional view showing the main part of a planar type radiation detector according to the seventh embodiment of the present invention.

As shown in FIG. 9, a second plate 4 may be attached to a rear plane to a supporting plate 3, and a first plate 5 may also serve as the casing of the detector.

The lightweight, smaller and thin detector is realized.

Eighth Embodiment

Figure 10:
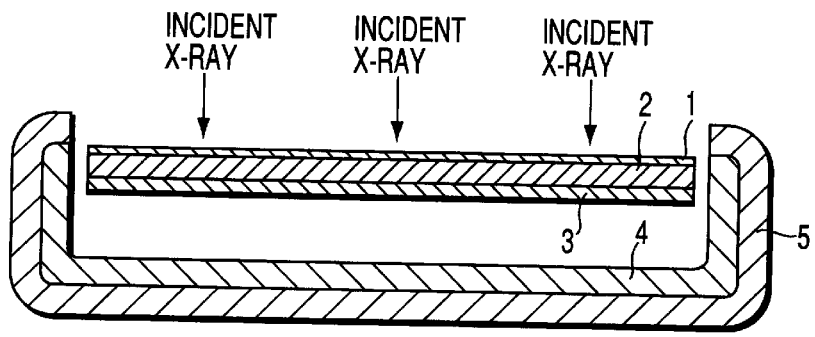
FIG. 10 is a sectional view showing the main part of a planar type radiation detector according to the eighth embodiment of the present invention.

As shown in FIG. 10, a second plate 4 may also serve as the casing of the detector together with a first plate 5.

The lightweight, smaller and thin detector is realized.

Ninth Embodiment

Figure 11:
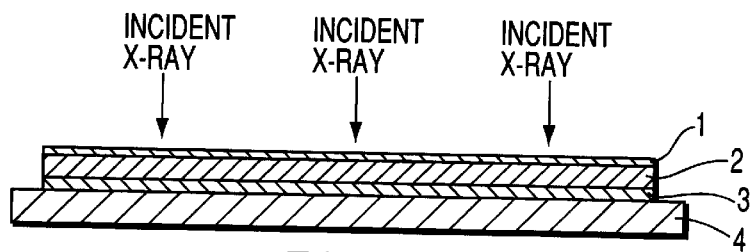
FIG. 11 is a sectional view showing the main part of a planar type radiation detector according to the ninth embodiment of the present invention.

When the first transmission X-ray transmitted through a supporting plate 3 is very weak, a first plate 5 can be omitted, as shown in FIG. 11. A leakage X-ray may be prevented or reduced to the safety standard value using only a second plate 4. A thickness of the second plate 4 is adjusted corresponding to material (density). The plate 4 formed from tungsten has a thickness of about 0.01 mm. The plate 4 formed from iron or light metal has a thickness of about 10 mm.

10th Embodiment

Figure 12:
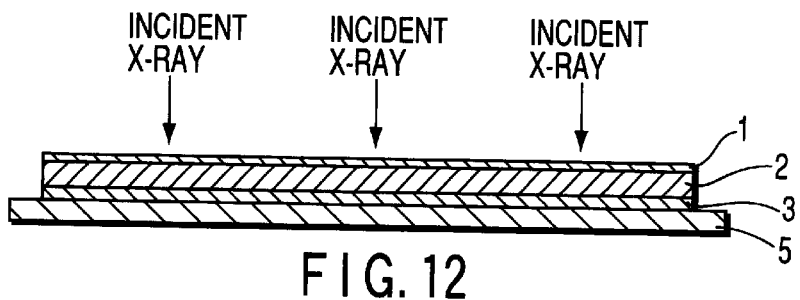
FIG. 12 is a sectional view showing the main part of a planar type radiation detector according to the 10th embodiment of the present invention.

When the first transmission X-ray transmitted through a supporting plate 3 is very weak, a second plate 4 can be omitted, and a first plate 5 having a small radiation absorbed dose may be attached to the supporting plate 3, as shown in FIG. 12.

11th Embodiment

Figure 13:
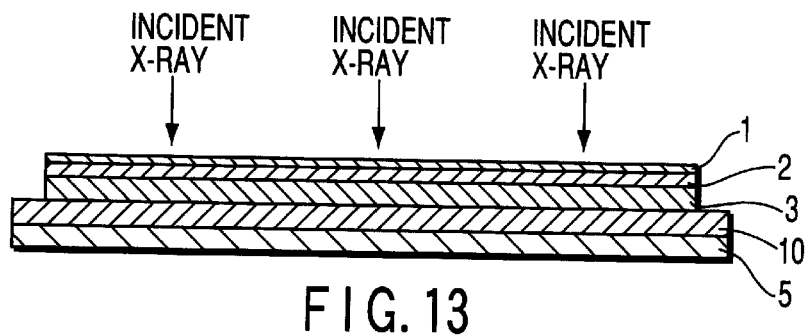
FIG. 13 is a sectional view showing the main part of a planar type radiation detector according to the 11th embodiment of the present invention.
Figure 14:
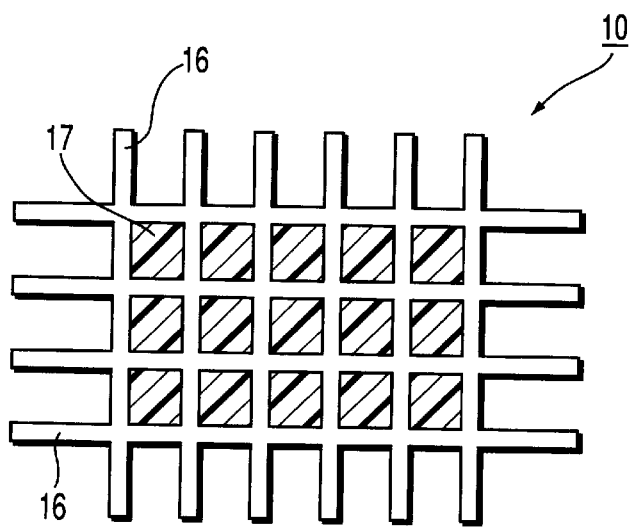
FIG. 14 is a sectional view showing the main part of a planar type radiation detector according to the 12th embodiment of the present invention.

As shown in FIG. 13, in place of a second plate 4, an X-ray grid 10 may be arranged on the rear plane of a supporting plate 3 to remove a backscattering ray generated by a first plate 5. This grid 10 is constructed by lattice portions 16 and spacers 17 surrounded by the lattice portions 16, as shown in FIG. 14. The lattice portions 16 are formed from, e.g., long lead bars and combined in a lattice shape to form the spacers 17. The spacer 17 may have a member formed from a material such as aluminum, wood, or paper that transmits the X-ray. In this grid 10, the amount of X-ray transmitted through the grid 10 is adjusted by adjusting the amount per unit volume of lead of the lattice portions 16. For example, the grid 10 has characteristics including, e.g., 101 p/cm, 10:1, paper, and Focal ∞.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A planar radiation detector comprising:
    conversion elements configured to convert a radiation incident from a front side into charges;
    electric charge read out elements arranged on a rear side of said conversion elements;

a supporting plate of said electric charge read out elements;

a first plate arranged on a rear side of said supporting plate; and a second plate inserted between said supporting plate and said first plate, said second plate being configured to absorb radiation and at a radiation absorbed dose smaller than that of said first plate.

2. A detector according to claim 1, wherein said second plate is configured not to substantially transmit a backscattering ray generated by said first plate to said conversion elements.

3. A detector according to claim 1, wherein said second plate is configured to generate a smaller back scattering ray than that of said first plate.

4. A detector according to claim 1, wherein a material and a thickness of said second plate is adjusted to be a littler radiation absorbed dose than that of said first plate.

5. A detector according to claim 1, wherein said second plate comprises:

a material having a higher rigidity than that of said first plate.

6. A detector according to claim 1, wherein said first plate comprises lead, and said second plate comprises iron.

7. A detector according to claim 1, wherein said first plate includes lead as a main component, and said second plate includes iron as a main component.

8. A detector according to claim 1, wherein said second plate comprises an element having an atomic number of not less than 22 as a main component.

9. A detector according to claim 1, wherein said second plates at least one element selected from the group consisting of Fe, Cu, and Pb.

10. A detector according to claim 1, wherein said second plate is fixed to a base via said first plate.

11. A detector according to claim 1, wherein said second plate is attached to a rear plane of said supporting plate to support said supporting plate, and said first plate is attached to a rear plane of said second plate.

12. A detector according to claim 1, wherein said second plate is attached to a rear plane of said supporting plate to support said supporting plate, and said first plate is spaced apart from said second plate.

13. A detector according to claim 1, wherein said second plate is spaced apart from said supporting plate, and said first plate is spaced apart from said second plate.

14. A detector according to claim 1, wherein said second plate is spaced apart from said supporting plate, and said first plate is attached to a rear plane of said second plate and supported by said second plate.

15. A detector according to claim 1, wherein said second plate comprises a casing of said planar radiation detector.

16. A detector according to claim 1, wherein said first plate comprises a casing of said planar radiation detector.

17. A detector according to claim 1, wherein said second plate comprises a casing of said planar radiation detector together with said first plate.

18. A detector according to claim 1, wherein said second plate has an area larger than an area of an effective region of said conversion elements.

19. A planar radiation detector comprising:

conversion elements configured to convert a radiation incident from a front side into charges;

electric charge read out elements attached on a rear plane of said conversion elements;

a supporting plate of said electric charge read out elements; and a plate comprising iron as a main component and attached on a rear plane of said supporting plate.

20. A planar radiation detector comprising:

conversion elements configured to convert a radiation incident from a front side into charges;

electric charge read out elements attached on a rear plane of said conversion elements;

a supporting plate of said electric charge read out elements;

a radiation shielding plate arranged on a rear side of said supporting plate; and a grid inserted between said supporting plate and said radiation shielding plate, said grid limiting transmission of a backscattering ray generated by said radiation shielding plate.

* * * * *